(12) United States Patent
Sim

(10) Patent No.: US 8,467,220 B2
(45) Date of Patent: Jun. 18, 2013

(54) DRAM DEVICE AND MANUFACTURING METHOD THEREOF

(76) Inventor: Jai Hoon Sim, Gyeonggi-do (KR)

( * ) Notice: Subject to any disclaimer, the term of this patent is extended or adjusted under 35 U.S.C. 154(b) by 421 days.

(21) Appl. No.: 12/856,481

(22) Filed: Aug. 13, 2010

(65) Prior Publication Data

US 2011/0170336 A1 Jul. 14, 2011

(30) Foreign Application Priority Data

Apr. 29, 2010 (KR) .................. 10-2010-0039954

(51) Int. Cl.
*G11C 5/06* (2006.01)
*G11C 11/24* (2006.01)
*H01L 27/108* (2006.01)

(52) U.S. Cl.
USPC ............... 365/72; 365/63; 365/149; 257/296; 257/302; 257/330; 257/E27.091

(58) Field of Classification Search
USPC ................ 365/51, 63, 72, 149; 257/296, 301, 257/302, 306, 330, E27.084–E27.086, E27.088, 257/E27.091
See application file for complete search history.

(56) References Cited

U.S. PATENT DOCUMENTS

| | | | | |
|---|---|---|---|---|
| 6,150,687 A | * | 11/2000 | Noble et al. | ................... 257/302 |
| 6,379,978 B2 | * | 4/2002 | Goebel et al. | ...................... 438/3 |
| 6,797,563 B2 | | 9/2004 | Miyai et al. | |
| 7,122,438 B2 | | 10/2006 | Sasaki | |
| 2010/0237407 A1 | | 9/2010 | Nojima | |
| 2012/0134195 A1 | * | 5/2012 | Sim | ................................ 365/72 |

FOREIGN PATENT DOCUMENTS

| | | |
|---|---|---|
| KR | 1020020020858 A | 3/2002 |
| KR | 1020070052653 A | 5/2007 |

* cited by examiner

*Primary Examiner* — Allison P Bernstein
(74) *Attorney, Agent, or Firm* — Robert D. Atkins; Patent Law Group:Atkins & Associates, P.C.

(57) ABSTRACT

The present invention relates to a DRAM device having 4F2 size cells and a method for fabricating the same. The DRAM device comprises plural word lines arranged parallel to each other in one direction, plural bit lines arranged parallel to each other and in an intersecting manner with the word line, and plural memory cells having a transistor and a capacitor connected electrically to a source terminal of the transistor. A gate terminal of the transistor is filling an associated trench between two adjacent memory cells in a bit line direction and simultaneously covering a sidewall of said two adjacent memory cells via a gate insulating film interposed between the gate terminal and said two adjacent memory cells. An interval between the gate terminals in the bit or the word line direction, is more distant than 1F, and the F means minimal processing size.

5 Claims, 17 Drawing Sheets

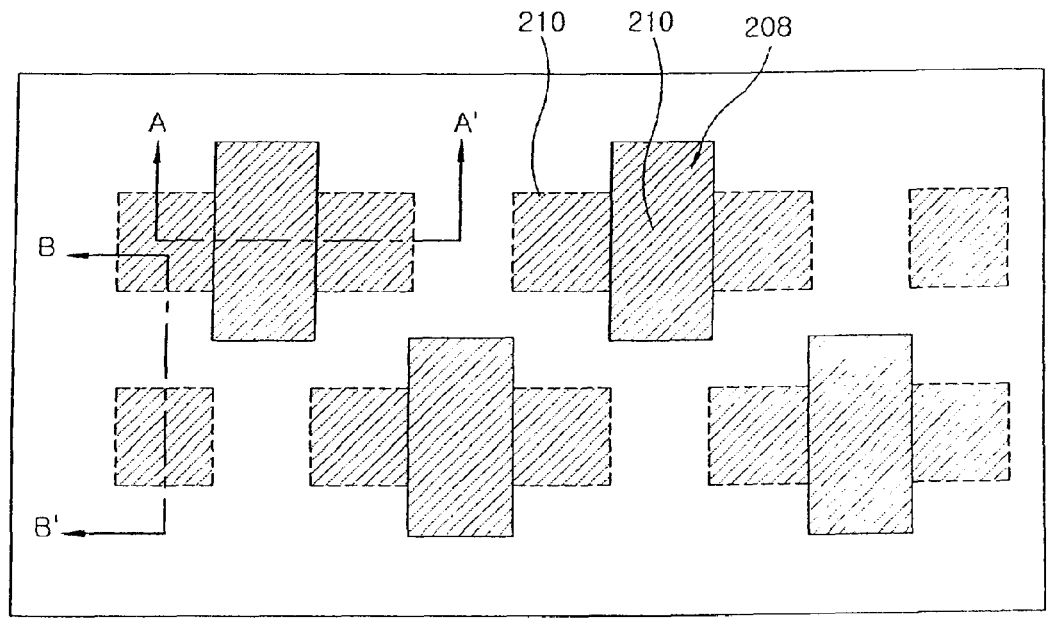
FIG. 8a
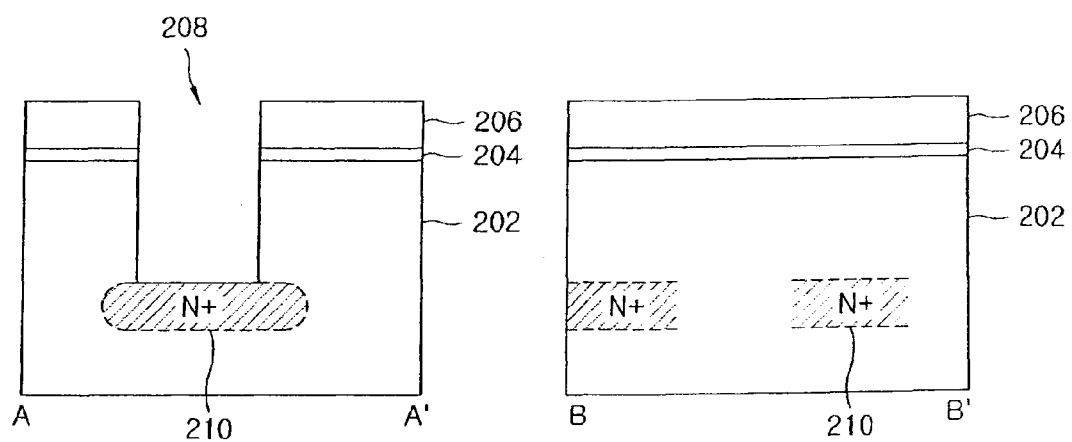
FIG. 8b     FIG. 8c

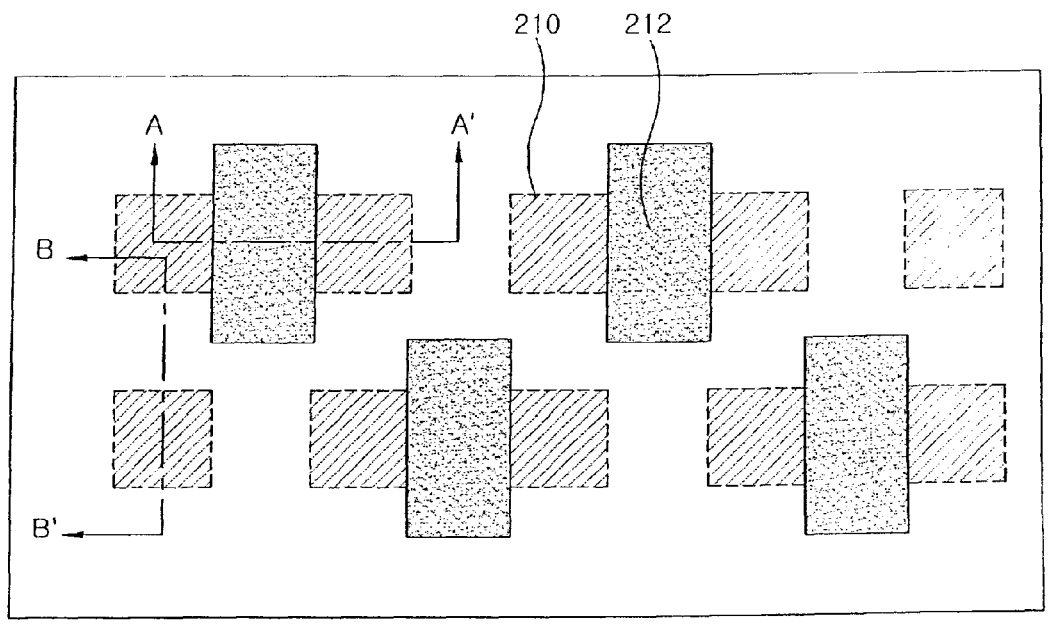
FIG. 9a
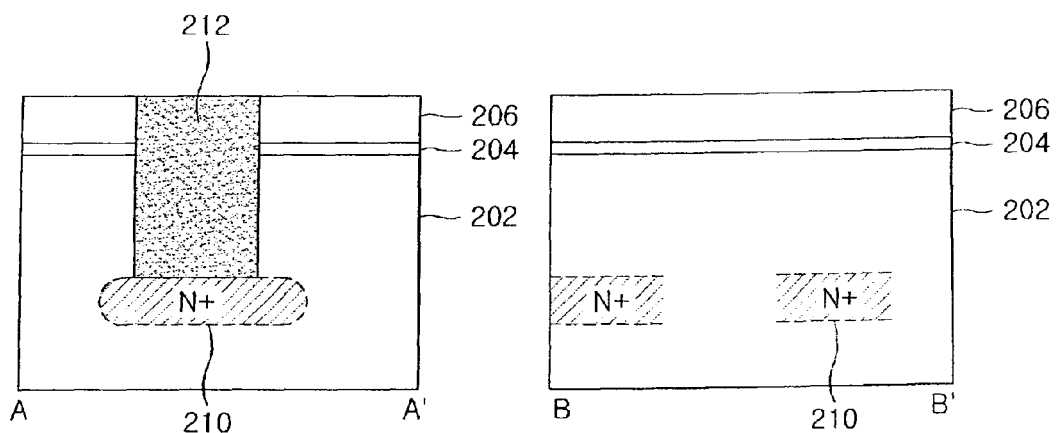
FIG. 9b           FIG. 9c

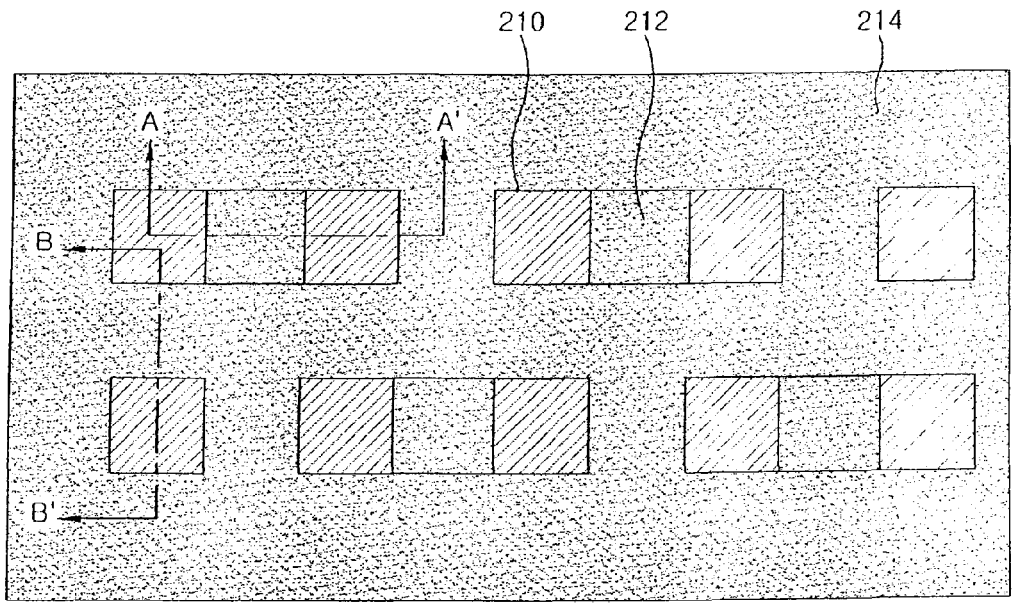
FIG. 10a
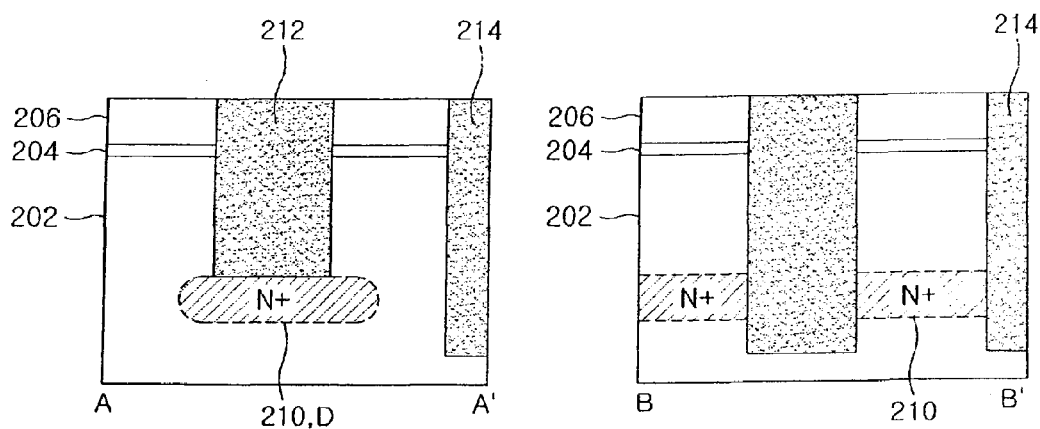
FIG. 10b　　　　　FIG. 10c

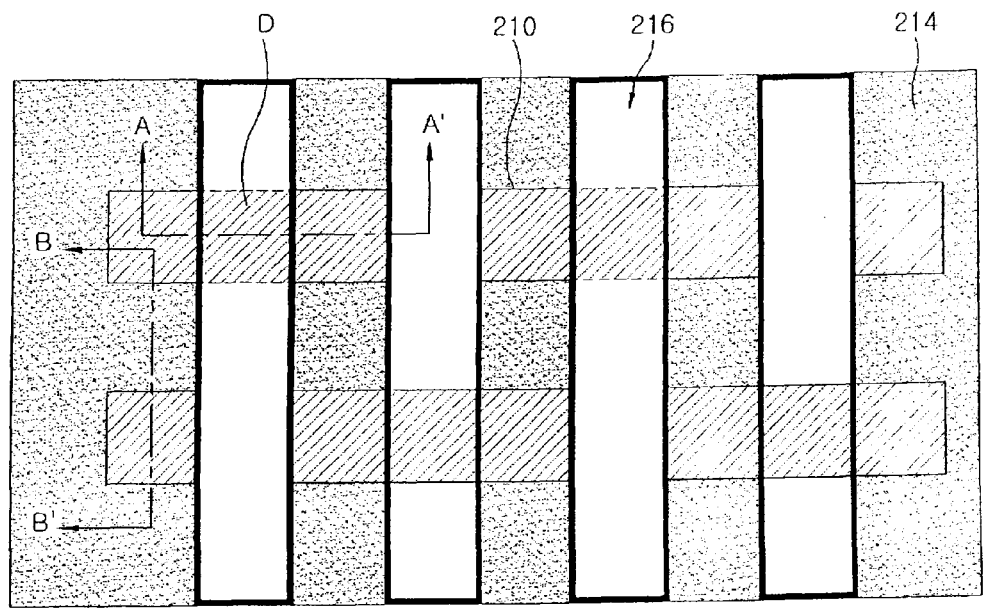
FIG. 11a
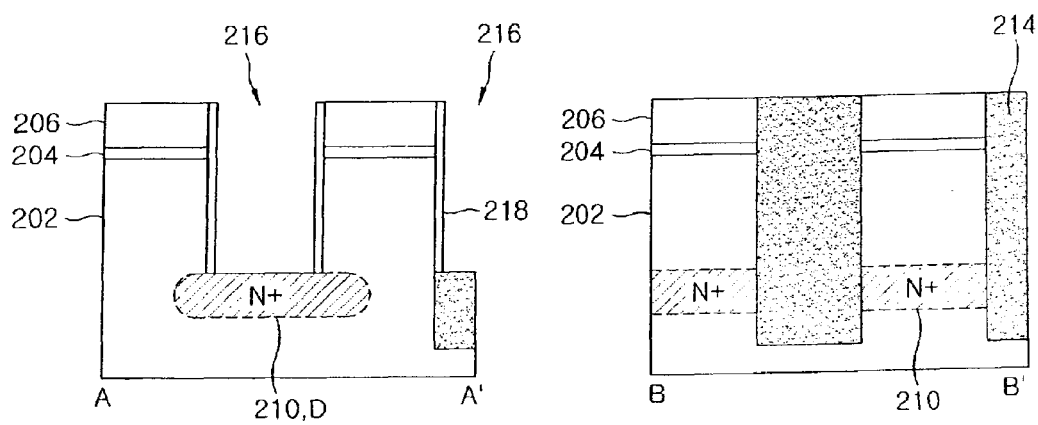
FIG. 11b  FIG. 11c

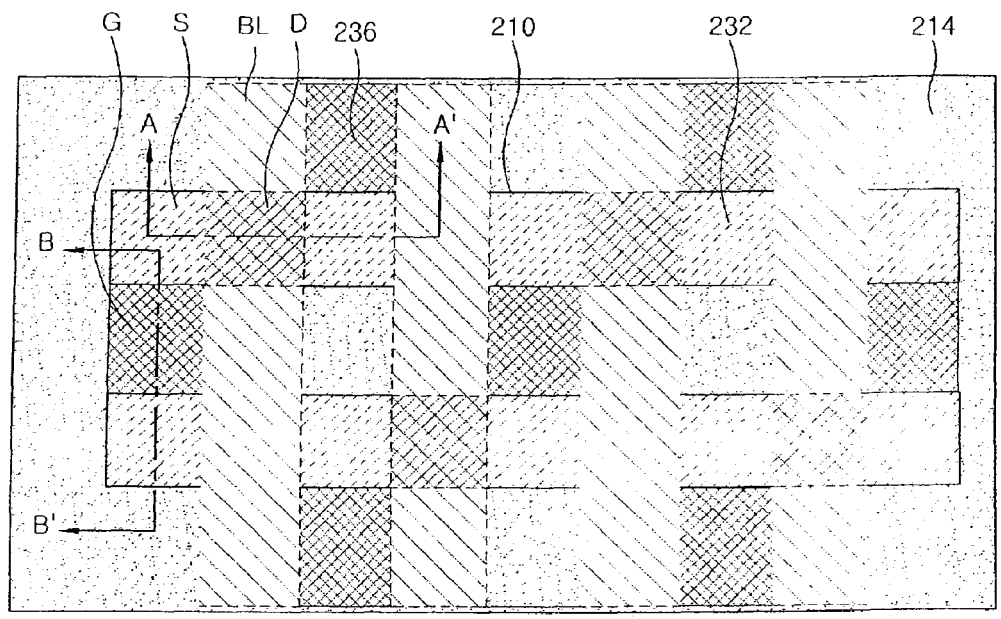
FIG. 15a
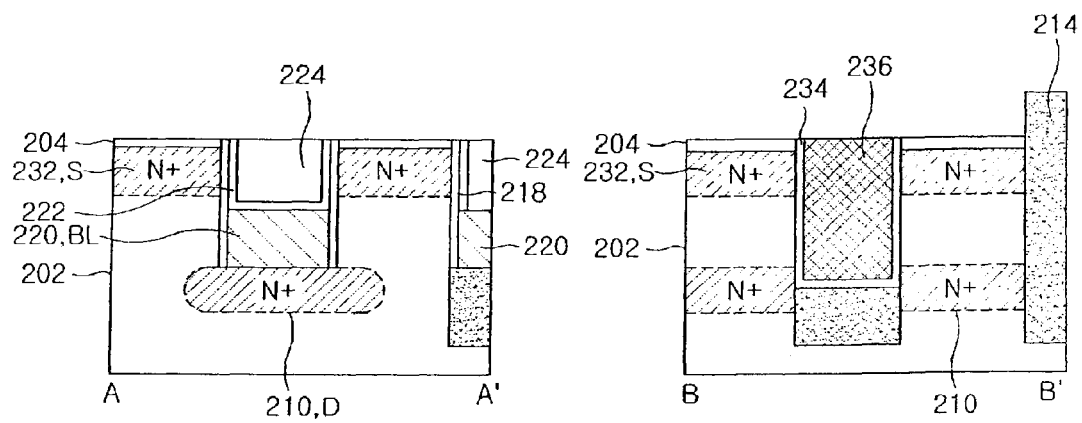
FIG. 15b
FIG. 15c

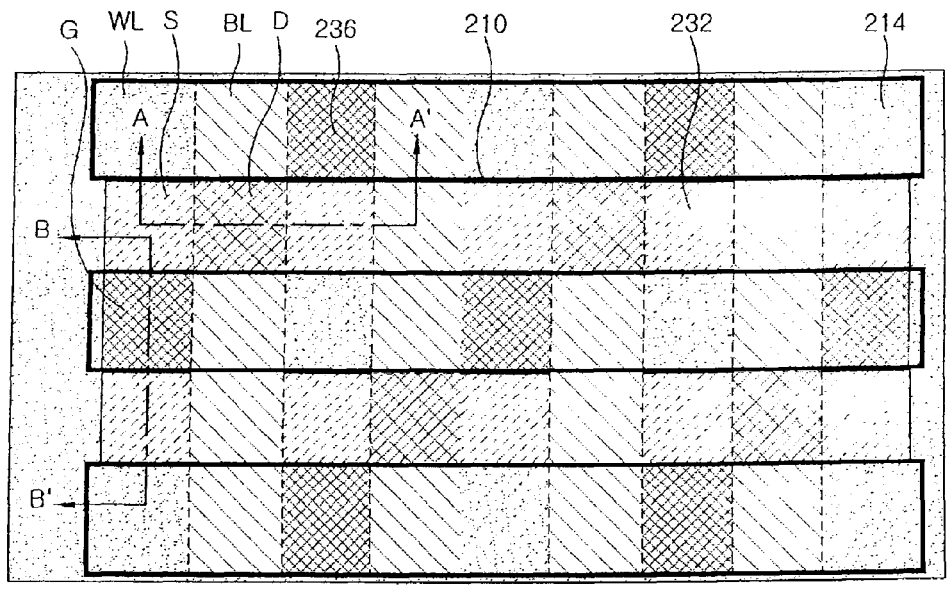
FIG. 16a
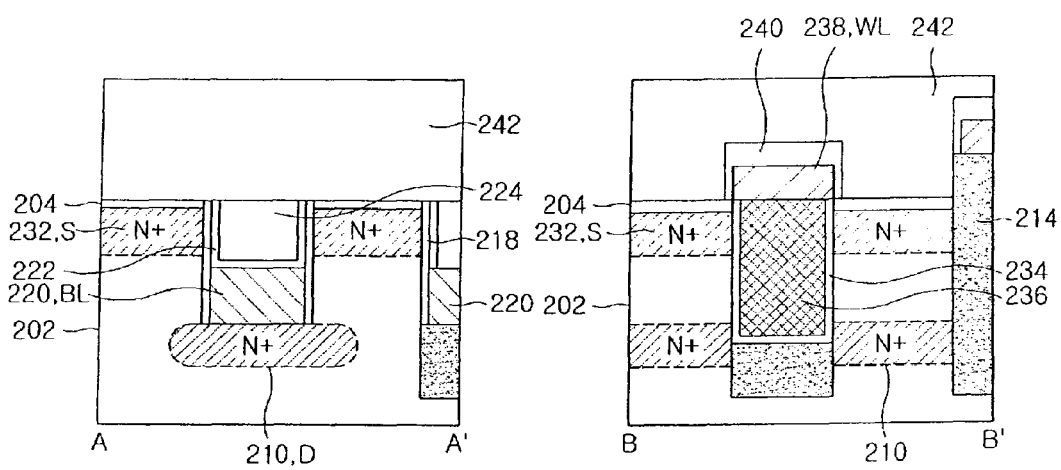
FIG. 16b  FIG. 16c

US 8,467,220 B2

DRAM DEVICE AND MANUFACTURING METHOD THEREOF

CLAIM TO FOREIGN PRIORITY

The present patent application claims the benefit of priority of Korean Patent Application No. 10-2010-0039954, filed Apr. 29, 2010.

FIELD OF THE INVENTION

The present invention relates to a DRAM device having 4F2 size cells and a manufacturing method thereof.

BACKGROUND OF THE INVENTION

Generally, RAM (Random Access Memory) refers to a computer memory unit, which is read and written freely, and is used mainly as a unit on which data is stored temporarily. DRAM (Dynamic Random Access Memory) is a kind of RAM and stored information is diminished as time passes and thus the diminished information has to be reproduced periodically. Meanwhile, DRAM is a simple structure and integrated easily and thus is used as a high-capacity temporary storage device.

DRAM comprises a plurality of word lines, a plurality of bit lines, and a plurality of memory cells which are connected electrically between the word lines and bit lines and have transistors and capacitors wherein capacity of DRAM is determined depending on the number of memory cells within the DRAM chip.

Currently, DRAM has a memory cell size of 8F2 (8F square). Here, minimal processing size (F) of DRAM corresponds to widths of word lines and bit lines and interval between the word line and bit line and area occupied by one memory cell is 8F2 (4F×2F). In order to fabricate high-capacity DRAM, the minimal process size (F) has to become smaller or the memory cell has to be designed or arranged more intensively under a predetermined minimal process size (F). To become the minimal process size (F) smaller meets a physical limitation and thus memory cell size tends to become smaller.

In order to arrange memory cells more intensively DRAMs having memory cell sizes of 6F2 (3F×2F) and 4F2 (2F×2F) have been proposed. Among them DRAM having a memory cell size of 4F2 includes the most intensively arranged memory cell and provides high-capacity DRAM.

FIG. 1 shows cell arrangement in a 4F2 memory cell DRAM. Referring to FIG. 1, memory cells 10 are placed at intersectional points of word lines WL0-WL3 and bit lines BL0-BL3, respectively.

A proposed configuration example of respective memory cell 10 is shown in FIG. 2. Referring to FIG. 2, a bit line BL is located on a lower side of the memory cell and a word line WL intersects the bit line BL and is placed thereabove. Meanwhile, a drain 11 is placed between the word line WL and bit line BL and further a channel 12 and a gate insulating member 13 surrounding the channel 12 are formed on the word line WL above the drain 11. Additionally, a source 14 is placed above the channel 12 and the gate insulating member 13. A capacitor 15 is placed above the source 14 and the upper part of the capacitor 15 is grounded. Here, the drain 11, gate insulating member 13 and source 14 form one transistor and the transistor and the capacitor 15 form one memory cell 10, and thus the memory cell 10 is formed vertically at an intersectional point of the bit line BL and word line WL.

However, DRAM of the 4F2 memory cells has the following problems.

(1) Since the channel 12 and the gate insulating member 13 are formed within the word line WL having a width of the minimal process size F, a fabrication process of DRAM is very difficult and intricate. In addition, resistance and capacitance of the word line WL are increased abruptly by the channel 12 and the gate insulating member 13 and thus an application thereof is difficult.

(2) The drain 11 formed of N+ implanted silicon is formed vertically above the bit line BL which is made of metal, and resistance of the drain is larger than that of the bit line BL. Additionally, in order to form the memory cell 10 including the drain 11 on the bit line BL formed of metal a process of Epi-Growth or poly-silicon crystallization is necessary and in this case leakage control of the memory cell 10 is difficult. As a result, DRAM of 4F2 memory cell has not been widely used regardless of its high integration degree.

SUMMARY OF THE INVENTION

The present invention has been proposed to solve the aforementioned drawbacks of the prior art, and one object of the present invention relates to providing a DRAM device and a manufacturing method thereof in which DRAM of 4F2 memory cell can be fabricated based on metal wiring technology of the same word line and bit line as the prior DRAM of 8F2 or 6F2 memory cell.

In order to achieve the aforementioned objects, the present invention provides a DRAM device comprising: plural word lines arranged parallel to each other in one direction; plural bit lines arranged parallel to each other in an intersecting manner to the word line; and plural memory cells having a transistor and a capacitor connected electrically to a source terminal of the transistor in which a gate terminal of the transistor is filling an associated one of trenches between two adjacent memory cells in the bit line direction and simultaneously covering a sidewall of said two adjacent memory cells via a gate insulating film interposed between the gate terminal and said two adjacent memory cells, and the gate terminal is connected electrically to the word line and a drain terminal of the transistor is connected electrically to the bit line wherein the gate terminal connected to one word line is arranged alternately to the gate terminal connected to an adjoining word line, and the drain terminal connected to one bit line is arranged alternately to the drain terminal connected to an adjoining bit line, and the drain terminal of the transistor of two adjoining memory cells in a direction of the word line is connected electrically with respect to one bit line, and wherein an interval between the gate terminals in the bit or the word line direction, is more distant than 1F, and the F means minimal processing size.

The gate terminal is placed at an interval four times a bit line width and the drain terminal is placed at an interval four times a word line width.

The bit line is formed to be buried within a semiconductor substrate.

The drain terminal is spaced vertically from the source terminal and at least a part thereof is overlapped in a plane.

The present invention provides a method for manufacturing a DRAM device, comprising steps of: forming plural drains at a predetermined depth of the silicon substrate in a continuous manner as a diamond shape; forming plural bit lines which are buried within the silicon substrate and extended vertically on the drain; forming plural sources on laterally adjoining region to the drain of the silicon substrate; forming plural gates at a predetermined depth of a vertically adjoining region to the source of the silicon substrate; forming plural word lines extending laterally on the gate; and forming plural capacitors on the source, and wherein the gate is filling an associated one of trenches between two adjacent memory cells in the bit line direction and simultaneously covering a sidewall of said two adjacent memory cells via a gate insulating film interposed between the gate and said two adjacent memory cells, and the gate connected to the word line is electrically connected to two adjacent memory cells in the bit line direction, sharing the gate connected to the word line with two adjacent memory cells in the bit line direction, and an interval between the gate in the bit or the word line direction, is more distant than 1F, and the F means minimal processing size.

The step of forming the drain comprises steps of: forming plural trenches on a semiconductor substrate, which are arranged in a continuous manner in a diamond shape wherein lateral length is four times bit line width and vertical length is four times word line width; forming a film doped with impurities within the trench; and performing a heat treatment process for the impurities to be diffused.

The step of forming the gate comprises steps of: forming a trench on a vertically adjoining region to the source of the silicon substrate; forming a gate insulating film on an inside wall of the trench; and filling inside of the gate insulating film with conductive material.

According to the embodiments of the present invention, the drain and gate of memory cell for 4F2 DRAM are formed lower than word line and bit line and thus the memory cell can be formed of silicon substrate and word line and bit line of metal material can be formed thereover. Additionally, minute configurations are not necessary to be formed within word line and bit line and thus resistance and capacitance of word line and bit line are not increased. Accordingly, according to the present invention highly integrated memory cells can be manufactured having the aforementioned advantages.

BRIEF DESCRIPTION OF THE DRAWINGS

FIGS. 8-17 show manufacturing methods of 4F2 memory cell DRAM according to the present invention.

DETAILED DESCRIPTION OF THE DRAWINGS

The preferred embodiments of a DRAM device according to the present invention will be described in detail referring to the accompanying drawings. However, it has to be understood that the present invention is not limited to the provided embodiments without departing from the spirit of the present invention.

Figure 1:
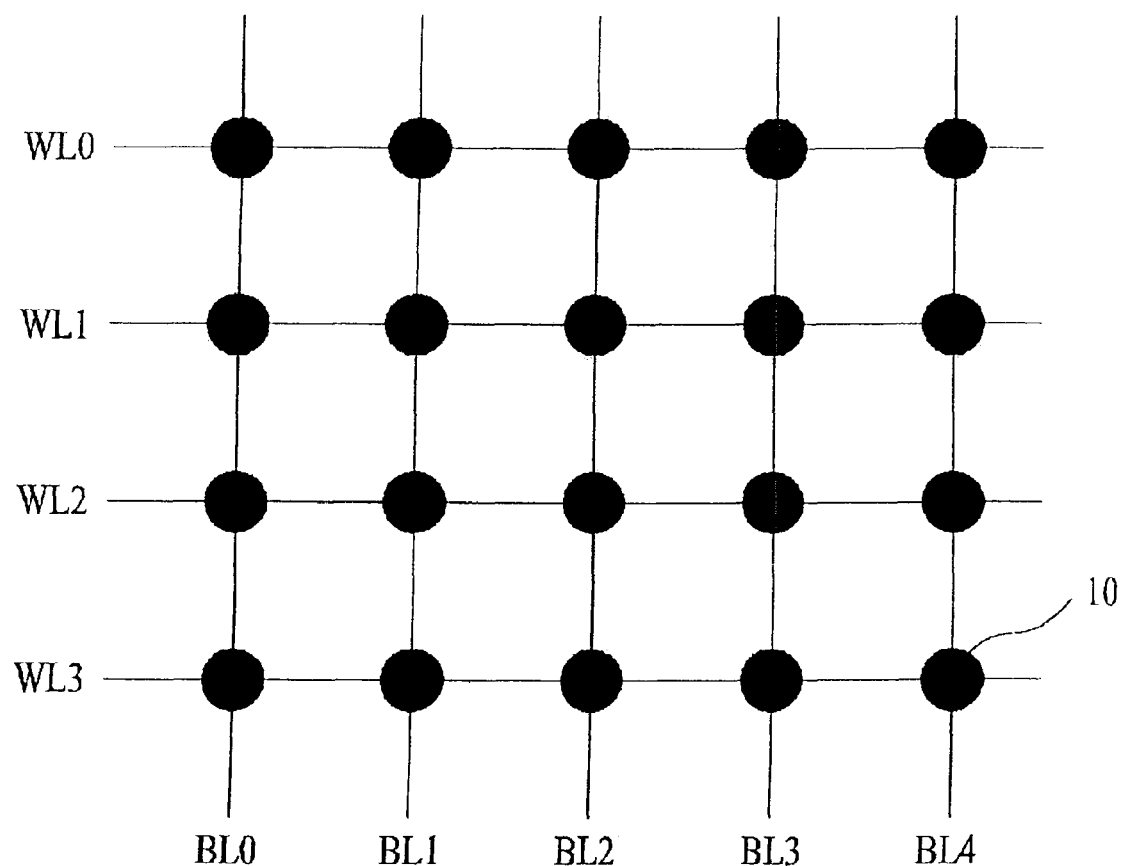
FIG. 1 shows a memory cell arrangement of 4F2 memory cell DRAM according to a prior art.
Figure 2:
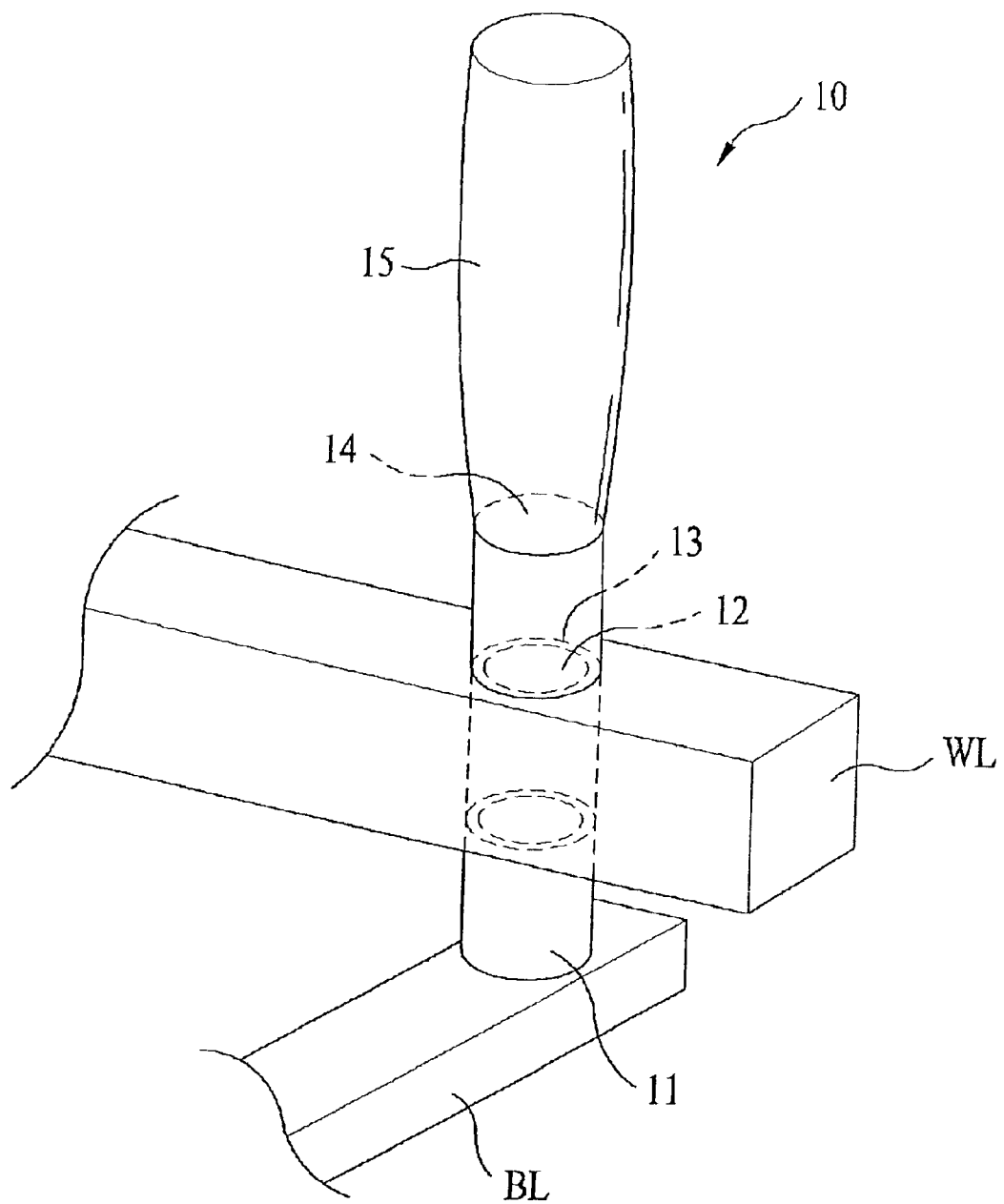
FIG. 2 shows a memory cell configuration of 4F2 memory cell DRAM according to a prior art.
Figure 3:
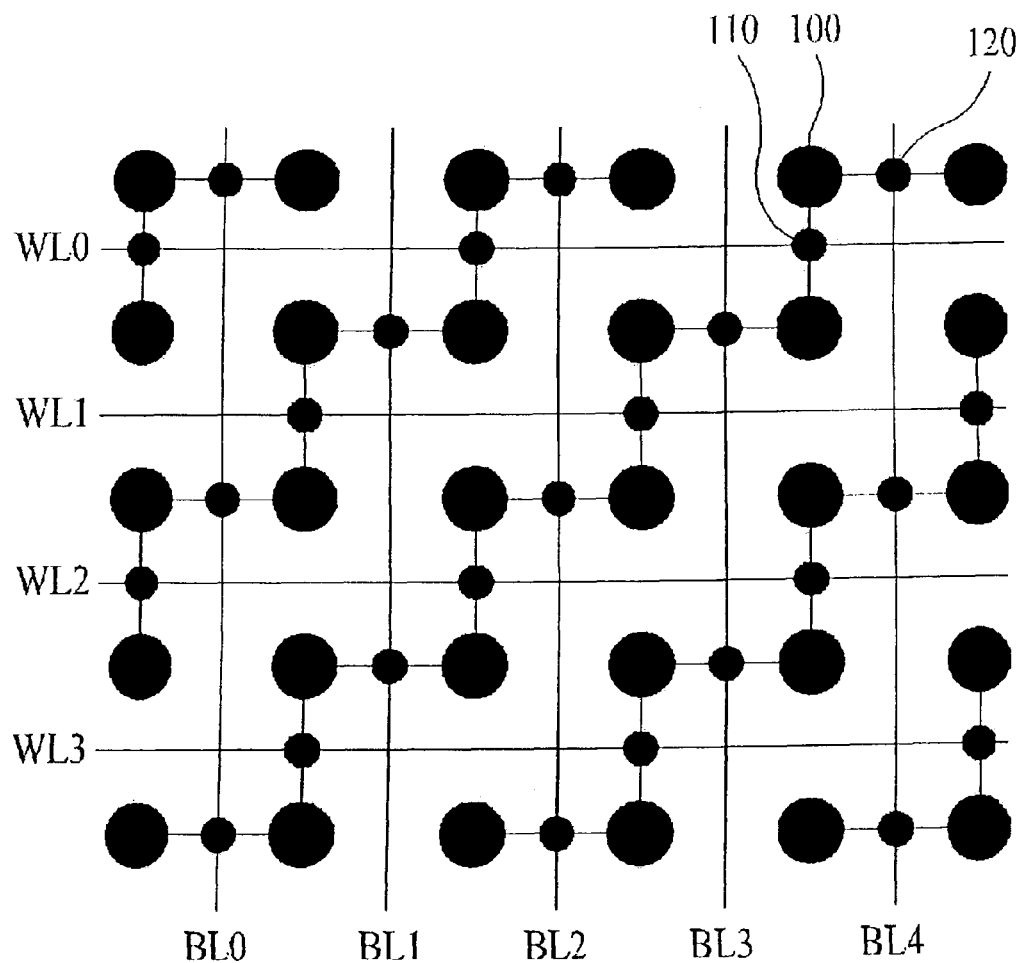
FIG. 3 shows a memory cell arrangement of 4F2 memory cell DRAM according to the present invention.

FIG. 3 shows schematically a memory cell arrangement for DRAM according to the present invention. Referring to FIG. 3, with respect to plural word lines WL0-WL3, their widths and intervals are preferably extended laterally as a minimal process size (F), and with respect to plural bit lines BL0-BL3 their widths and intervals are preferably extended vertically as a minimal process size (F), and further memory cells 100 are placed on parts (respective vertical and lateral lengths correspond to the minimal process size (F)) which are not occupied by the word lines WL0-WL3 and the bit lines BL0-BL3, respectively. Numbers of the memory cells 100 are calculated through multiplying numbers of the word lines by numbers of the bit lines, and further area occupied by respective memory cell becomes 4F2 (2F×2F).

One end 110 (referred to as a gate terminal which is described below) of a memory cell 100 is connected electrically to the word line and the other end 120 (referred to as a drain terminal which is described below) of the memory cell 100 is connected electrically to the bit line. One end 110 is arranged at an interval four times minimal process size (4F) along one word line and the other end 120 of the memory cell is arranged at an interval four times minimal process size (4F) along one bit line. One end 110 of the memory cell arranged along one word line is placed alternately on one end 110 of the memory cell arranged along adjoining word line and thus the one ends 110 of the memory cells are arranged in a diamond shape having vertical and lateral lengths of four times minimal process size (4F). In the same manner, the other end 120 of the memory cell arranged along one bit line is placed alternately on the other end 120 of the memory cell arranged along adjoining bit line and thus the other ends 120 of the memory cells are arranged in a diamond shape having vertical and lateral lengths of four times minimal process size (4F).

One end 110 of two adjoining memory cells 100 is connected electrically with respect to one word line and the other end 120 of two adjoining memory cells 100 is connected electrically with respect to one bit line, and thus the memory cells are shown to be connected in a stepwise in FIG. 3.

Figure 4:
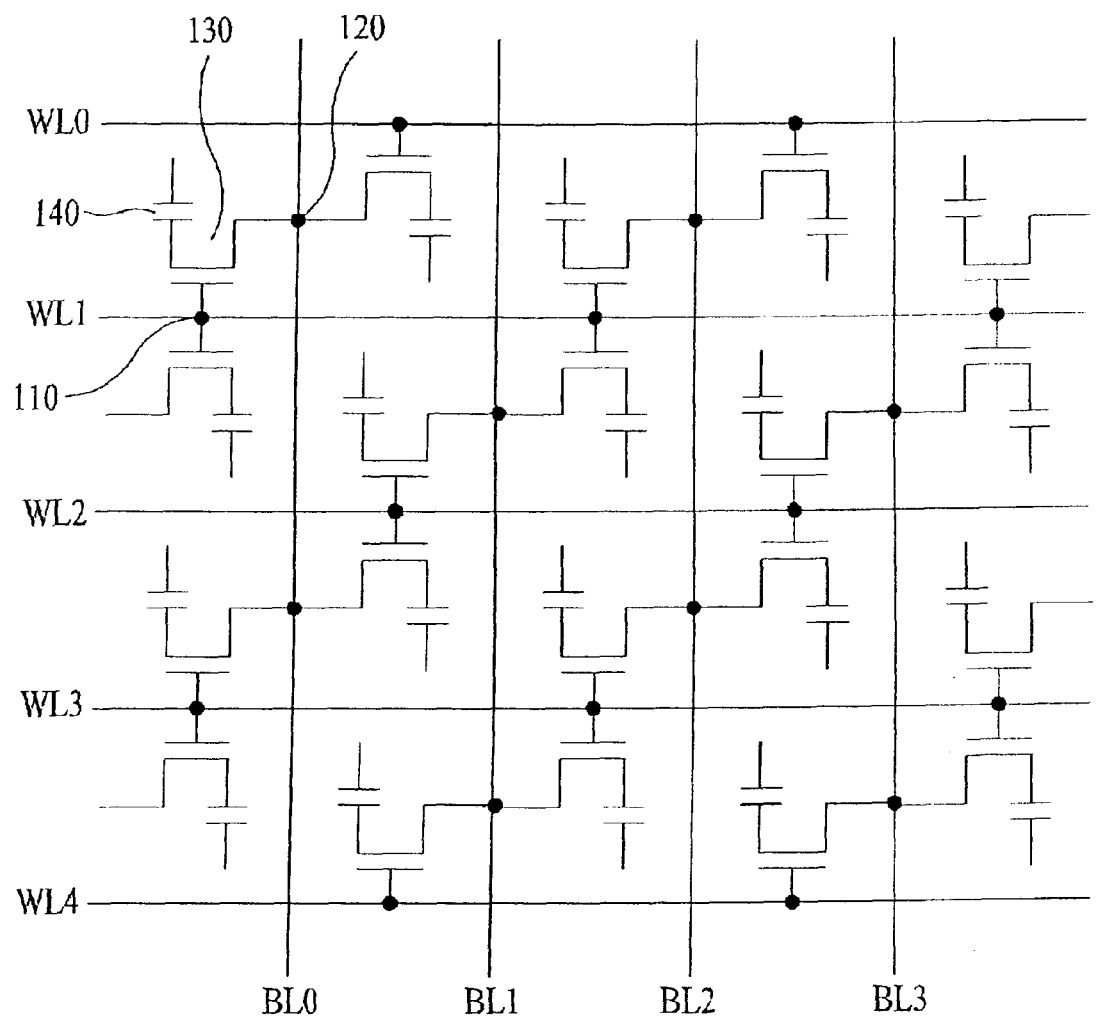
FIG. 4 shows a circuit of 4F2 memory cell DRAM according to the present invention.

In more detail, referring to circuit shown in FIG. 4, the memory cell 100 includes a transistor 130 and a capacitor 140. A source terminal of the transistor 130 is connected electrically to one end of the capacitor 140 and a gate terminal (referred to as one end 110 of the memory cell 100) is connected electrically to the word line WL1, and a drain terminal (referred to as the other end of the memory cell 120) is connected electrically to the bit line BL0. The gate terminal 110 of the transistor 130 is formed of gate oxide and the drain terminal 120 of the transistor 130 is formed of N+implanted silicon. One end of the capacitor 140 is connected electrically to the source terminal of the transistor 130 and the other end of the capacitor 140 is grounded (not shown).

Figure 5:
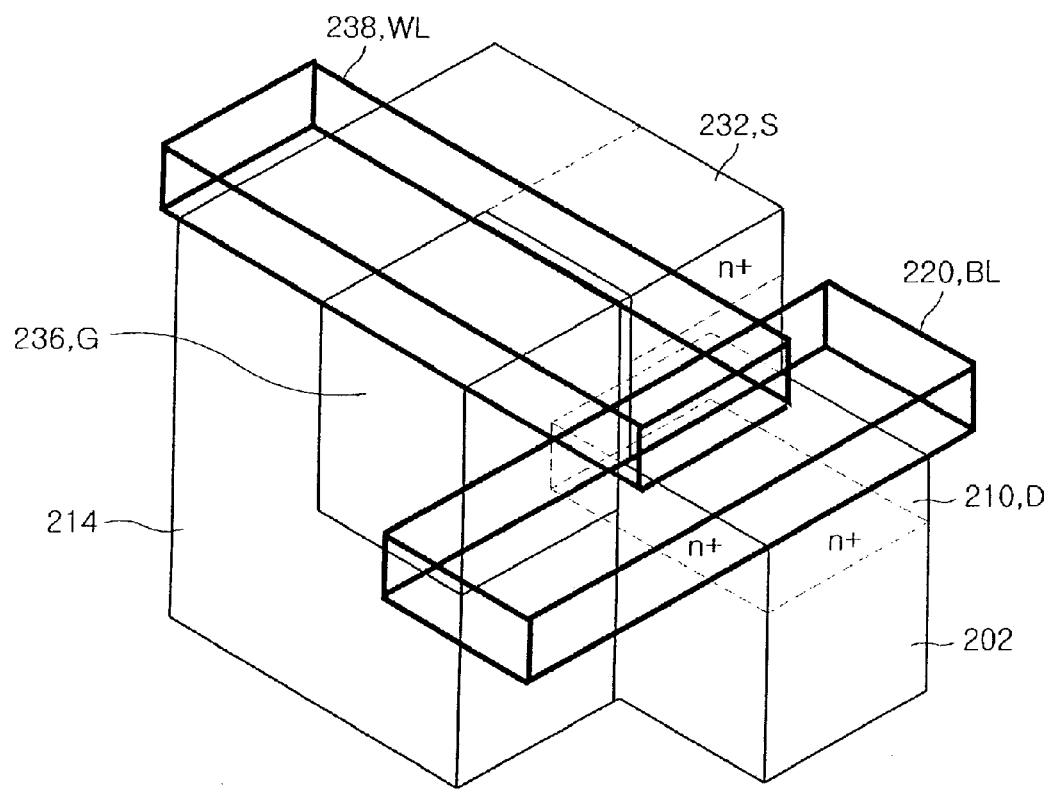
FIG. 5 shows schematically a fabricated 4F2 memory cell DRAM according to one embodiment of the present invention.
Figure 6:
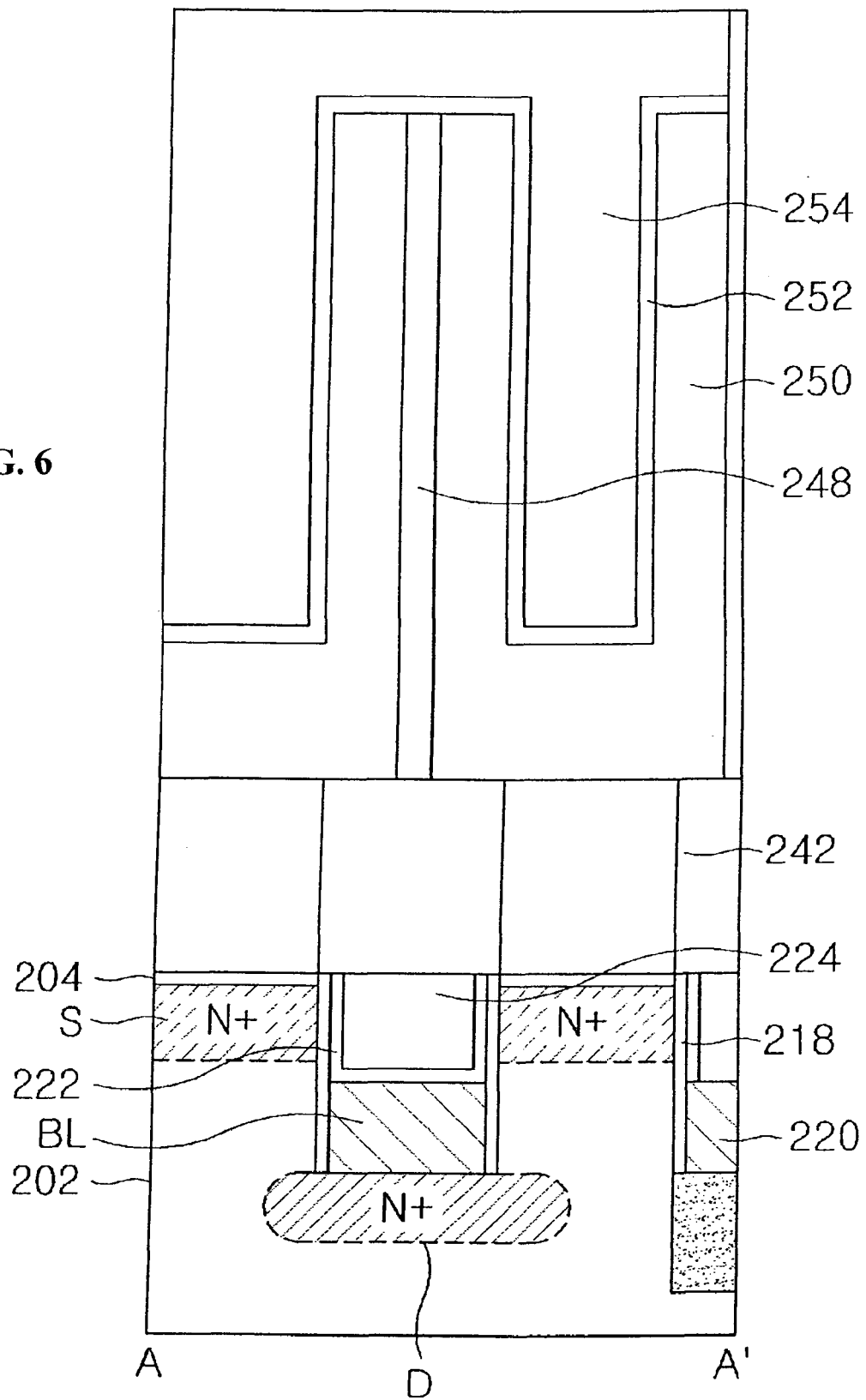
FIGS. 6 and 7 show sectionally 4F2 memory cell DRAM according to one embodiment of the present invention.
Figure 7:
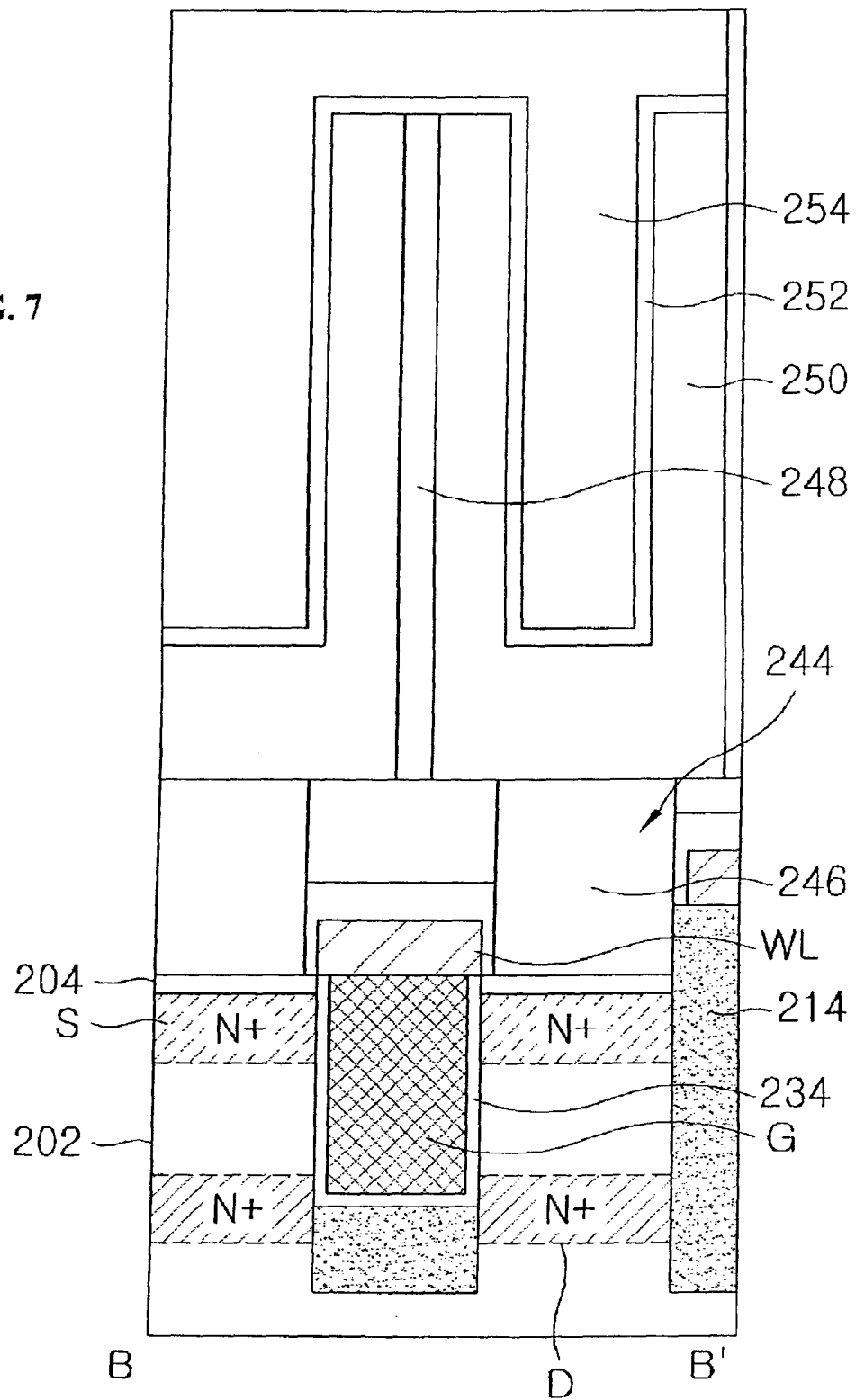

A more detailed configuration of DRAM device according to one embodiment of the present invention is described in FIGS. 5-7. In FIG. 5, upper configuration of word line and bit line is omitted for clarity. FIG. 6 is a sectional view taken by a line parallel to the word line WL in FIG. 5 and FIG. 7 is a sectional view taken by a line parallel to the bit line BL in FIG. 5.

Referring to FIGS. 5-7, DRAM device according to one embodiment of the present invention includes a bit line BL which is buried within a semiconductor substrate 202 and formed in one direction, a word line WL which is formed on the semiconductor substrate 202 in a intersectional direction of the bit line BL, and a memory cell which is connected electrically to the bit line BL and the word line WL.

The bit line BL is formed to be buried within the semiconductor substrate 202. The bit line BL is formed of conductive material such as poly-silicon, metal or metal alloy, etc. A drain D is formed on the semiconductor substrate 202 below the bit line BL. The drain D is diffused horizontally toward the lower side of the source S and the drain D is spaced vertically from the source S and at least one part of them is overlapped on a plane. As a result, a channel is formed between the drain D and the source S. One memory cell 100 shares the drain D with other adjoining memory cells, placing the bit line BL therebetween.

The word line WL is formed on the semiconductor substrate 202. The word line WL is formed of conductive material such as poly-silicon, metal or metal alloy, etc. A gate G is formed on the semiconductor substrate 202 below the word line WL. The memory cell 100 shares the gate G with other adjoining memory cells, placing the word line WL therebetween.

That is, the transistor 130 of the memory cell 100 includes the source S, the drain D and the gate G, as shown in FIGS. 5-7 wherein the drain D is shared with adjoining memory cell at one side and is connected electrically to the bit line BL and further the gate G is shared with adjoining memory cells at the other side and is connected electrically to the word line WL.

A more detailed configuration of DRAM, including the bit line BL, the word line WL and the memory cell 100, will be described below. In particular, a manufacturing method of 4F2 memory cell DRAM from silicon substrate 202 according to the present invention will be described in FIGS. 8-17.

FIG. 8 shows a silicon substrate on which N+ implanted regions are formed. FIG. 8(a) is a plan view, FIG. 8(b) is a sectional view taken by A-A' in FIG. 8(a), and FIG. 8(c) is a sectional view taken by B-B' in FIG. 8(a). In the following description, this indication of figure relation will be applied in the same way.

Referring to FIG. 8, pad oxide film 204 and pad nitride film 206 are formed on the semiconductor substrate 202. The pad oxide film 204 may be formed using oxidation process, etc., and the pad nitride film 206 may be formed using Chemical Vapor Deposition (CVD), etc. The pad oxide film 204 allows the pad nitride film 206 to be deposited easily on the semiconductor substrate 202 and the pad nitride film functions as etching mask or polishing stopping film in the following process.

Subsequently, the semiconductor substrate 202 is etched at a predetermined depth through photolithograph process using a predetermined mask to form plural first trenches 208. The region of the first trench 208 includes region on which the drain D is formed among the region on which the bit line BL is formed later. For example, the first trench 208 has laterally a minimal process size (F) length and has vertically two times minimal process size (2F) length.

Next, N+ implantation process is performed on the semiconductor substrate 202 and a first N+ implant region 210 to which N+ is implanted is formed on bottom surface of the first trench 208. The first N+ implant region 210 functions as the drain D of the memory cell 100. N+ ions are diffused to side direction (horizontally) using a heat treatment process after the N+ implantation process for the first implant region 210 to be diffused. Accordingly, the first N+ implant region 210 is diffused to not only a region on which bit line may be formed but also to a region on which source may be formed. The first N+ implant region 210 may be diffused not only laterally but also vertically in FIG. 8(a), however, vertical diffused region is removed through forming a device separation film later. In FIG. 8, lateral diffused region is only shown for clarity. Meanwhile, the first N+ implant region 210 may be formed such that N+ implanted conductive or nonconductive film is formed in the first trench 208 and then N+ ion within the film is diffused inside the semiconductor substrate 202 using a heat treatment process.

Referring to FIG. 9, a first insulating film 212 is formed over the entire N+ implant region for the first trench 208 to be buried. The first insulating film 212 may be formed of material having different etching selection ratio from the pad nitride film 206. Subsequently, etching or polishing process is performed using the pad nitride film as a stopping film. Accordingly, the first insulating film 212 remains within the first trench 208.

Referring to FIGS. 10a-10c, a device separation film 214 is formed by etching the semiconductor substrate 202 at a predetermined depth except for the region on which drain and source are formed, using a device separation mask (not shown), and burying the insulating film. The insulating film may be formed of material having a different etching ratio from the pad nitride film 206. The device separation film 214 may be formed more deeply than the first N+ implant region 210 in order for charges not to be moved between first adjoining N+ implant regions 210.

Referring to FIGS. 11a-11c, plural grooves 216 are formed in a region on which bit line is formed. The first insulating film 212 and the device separation film 214 are removed on a bit line formation region by forming the groove 216. As a result, the first N+ implant region 210 placed below the first insulating film 212 is exposed outside. Subsequently, a first side wall insulating film 218 is formed on a side wall of the groove 216. The first side wall insulating film 218 is formed such that insulating film is formed on the entire upper part including the groove 216 and then etched except for the first side wall insulating film 218.

Referring to FIGS. 8-11, the procedures are described such that the first N+ implant region 210 is formed in the first trench 208 and the device separation film 214 is formed, and the groove 216 is formed. Meanwhile, according to another embodiment of the present invention, the device separation film 214 is formed on a region except for drain formation region and source formation region, and the groove 216 is formed and then the first N+ implant region 210 may be formed. The semiconductor substrate manufactured according to the present embodiment has the same configuration as shown in FIG. 11.

Figure 12A:
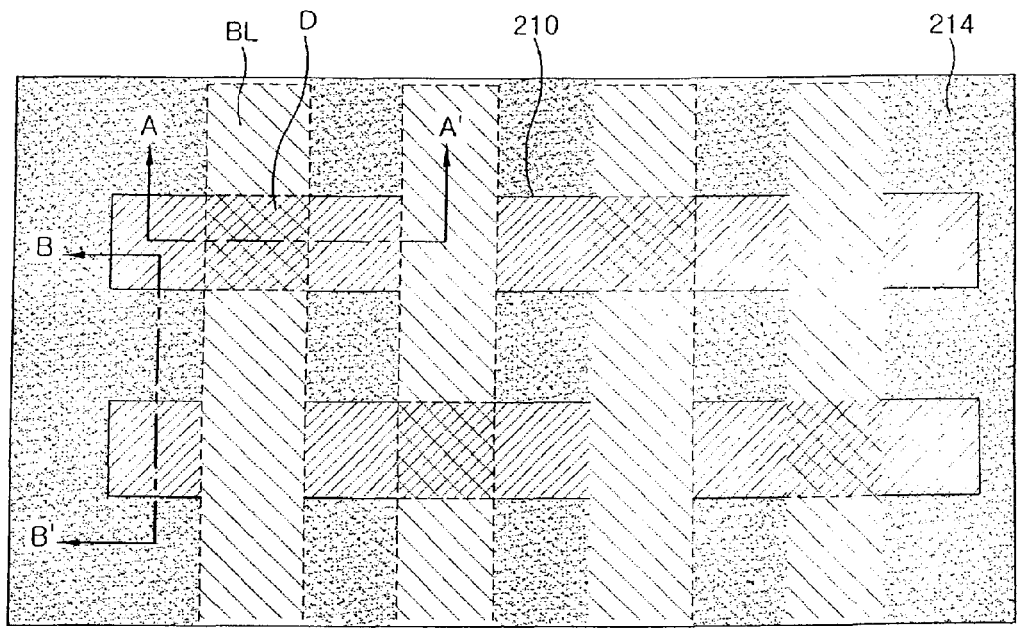
Figure 12B:
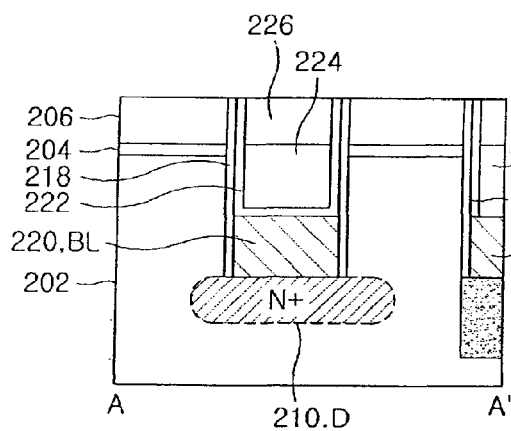
Figure 12C:
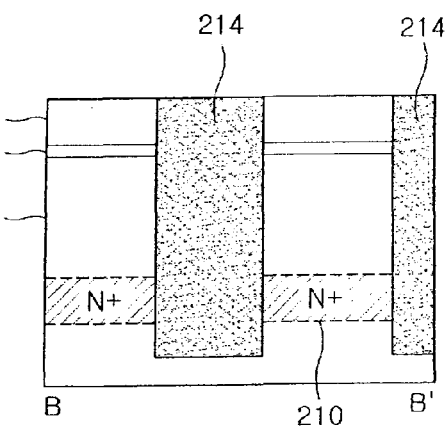

Referring to FIGS. 12a-12c, a conductive film 220 having a predetermined thickness is formed within the groove 216. The conductive film 220 functions as the bit line BL extending vertically. The conductive film 220 may be formed of conductive material such as poly-silicon, metal, metal oxide, metal nitride, etc. The width and interval of the conductive film 220 preferably corresponds to the minimal process size (F).

Next, a second side wall insulating film 222 is formed over the conductive film 220 and on a side wall of the groove 216. Subsequently, a second insulating film 224 having the same height of the upper surface as the upper surface of the pad oxide film 204 is formed, and then a third insulating film 226 having the same height of the upper surface as the upper surface of the nitride film 206, is formed so that the groove 216 is buried entirely.

Figure 13A:
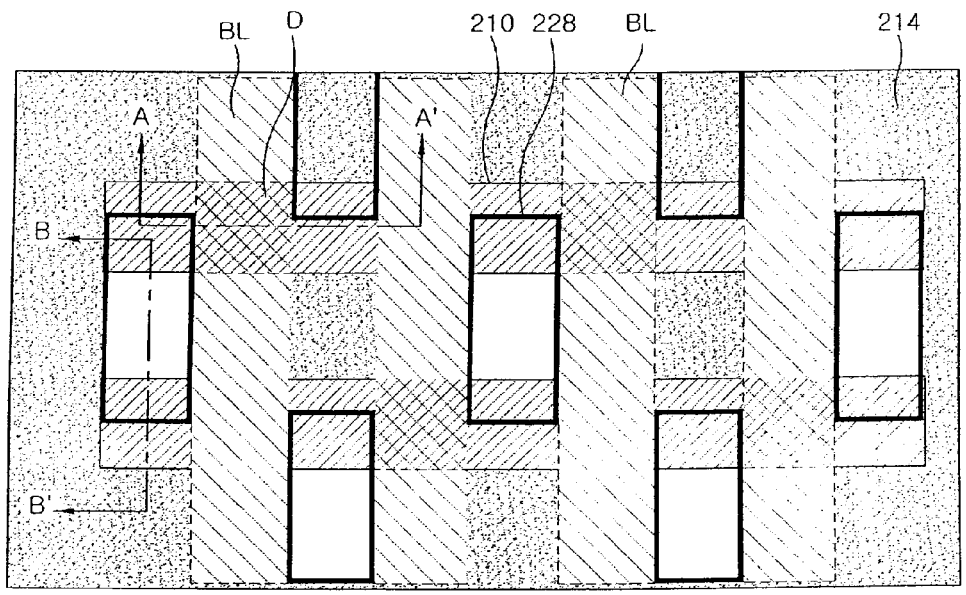
Figure 13B:
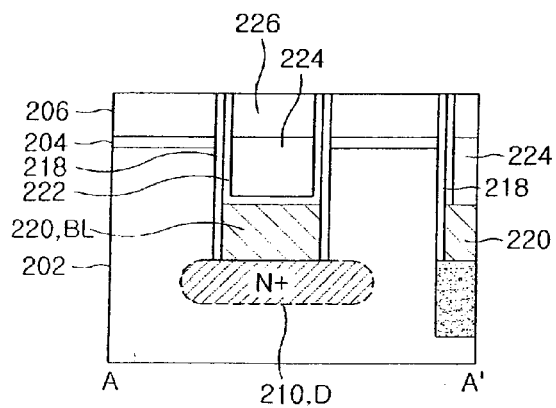
Figure 13C:
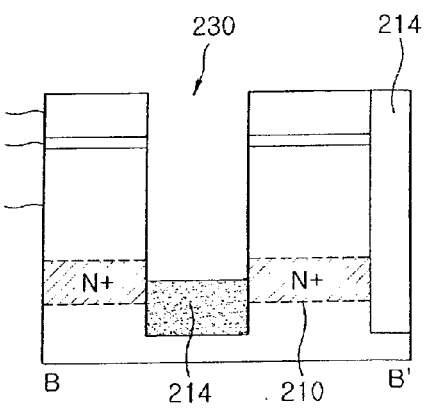

Referring to FIGS. 13a-13c, second plural trenches 230 are formed on the semiconductor substrate 220 by etching at a predetermined depth the device separation film 214 placed on a gate formation region using an etching mask 228. In FIG. 13, the etching mask 228 includes a gate formation region and a part of source formation region, however, the device separation film 214 placed on the gate formation region is etched and the source formation region is not etched by the pad nitride film 206. The second trench 230 may be etched more deeply than the upper surface of the first implant region 210.

Figure 14A:
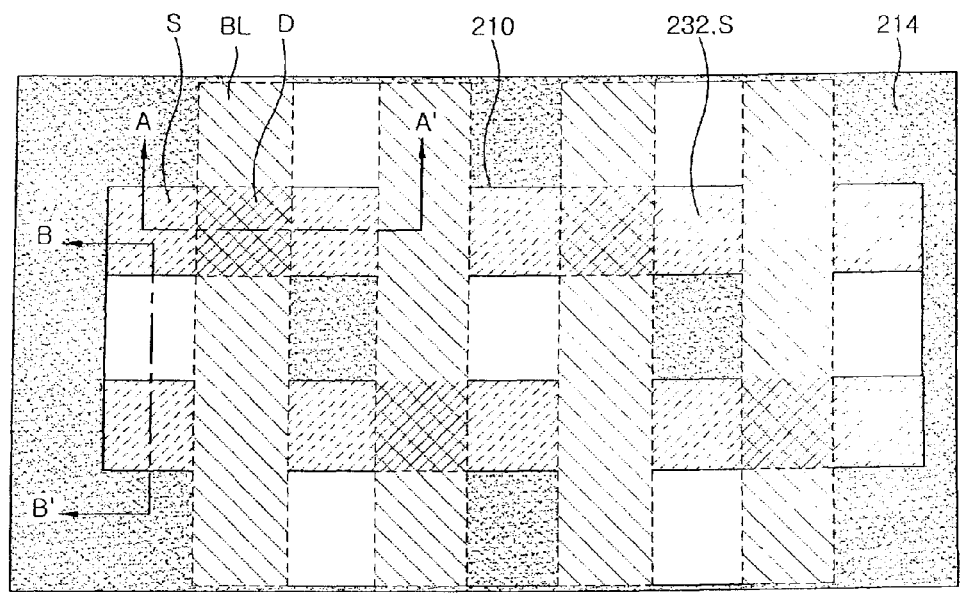
Figure 14B:
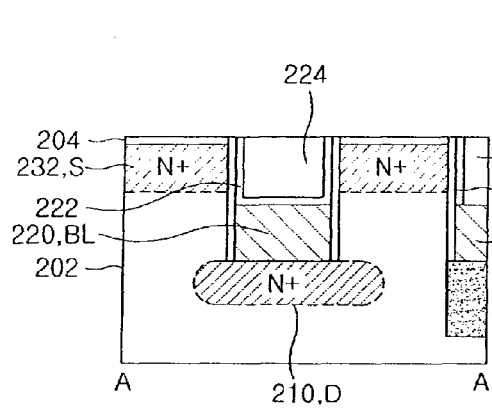
Figure 14C:
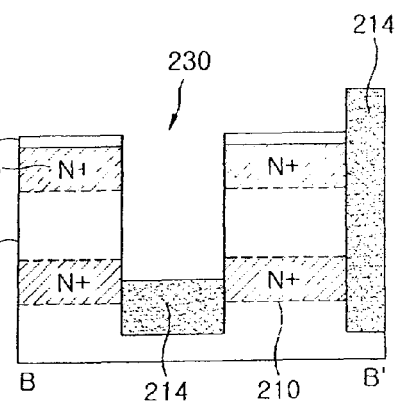

Referring to FIGS. 14a-14c, the pad nitride film 206 and the third insulating film 226 formed on the semiconductor substrate 202 are removed. Subsequently, a second N+ implant region 232 is formed on the semiconductor substrate 202 using N+ implantation process. As shown in FIG. 14, the second N+ implant region 232 is formed on a region not to be occupied by the bit line BL and the word line. The second N+ implant region 232 functions as a source S. The first implant region 210 functioning as the drain D is formed lower than the second N+ implant region 232 functioning as the source S and further the first N+ implant region 210 is spaced vertically from the second N+ implant region 232 and overlapped in at least a part thereof so that a channel is formed between the first N+ implant region 210 as the drain D and the second N+ implant region 232 as the source S.

Meanwhile, ion injection process for forming a channel within the semiconductor substrate 202 may be performed before the second N+ implant region 232 is formed. The ion injection process for forming a channel may be performed using an incline ion injection process or vertical ion injection process with respect to the semiconductor substrate 202 so that impurities are injected into a side wall of the second trench 230.

Referring to FIGS. 15a-15c, a gate insulating film 234 is formed on a side wall of the second trench 230 and then conductive film is formed for the second trench 230 to be buried to form a gate electrode 236. The gate insulating film 234 functions as a gate G and the gate electrode 236 connects electrically the gate insulating film 234 with word line which is formed in the following.

Referring to FIGS. 16a-16c, plural word lines 238 extending laterally are formed on the gate electrode 236. A width and interval of the word line 238 may correspond to the minimal process size (F). A fourth insulating film 240 may be formed on an upper part and side wall of the word line 238. Additionally, an interlayer insulating film 242 is formed over the entire semiconductor substrate 202.

Figure 17A:
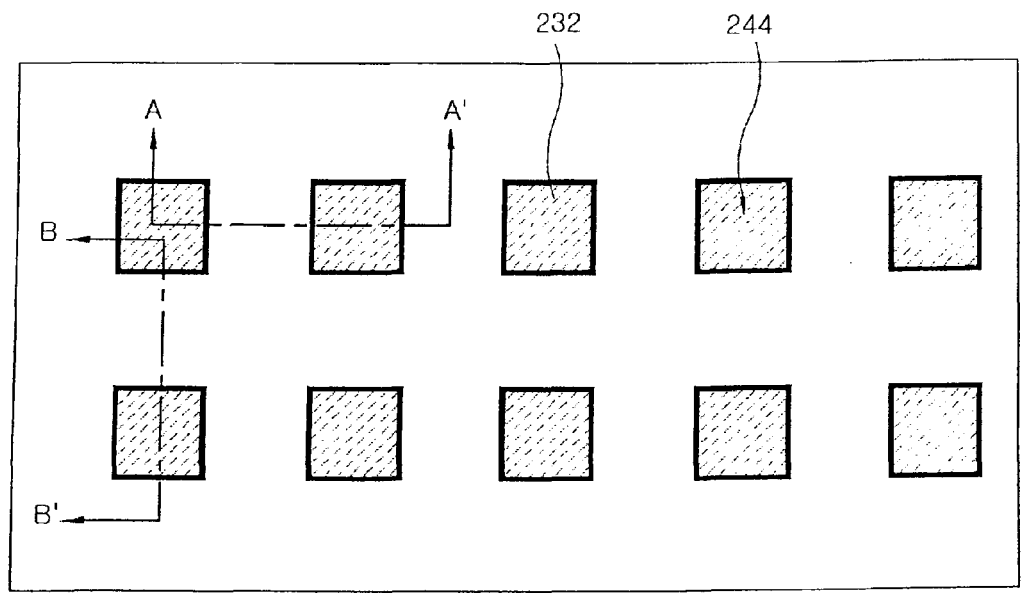
Figure 17B:
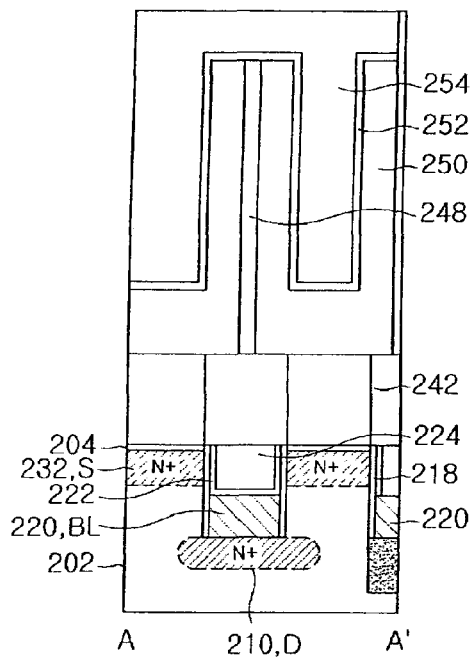
Figure 17C:
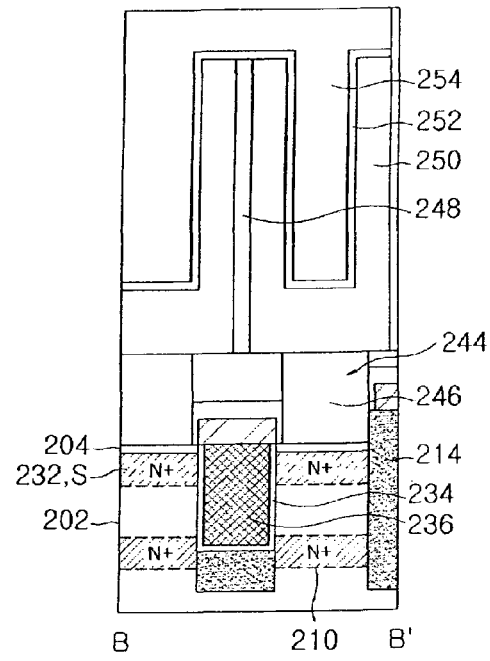

Referring to FIG. 17a, the interlayer insulating film 242 over the second N+ implant region 232 is removed and the second N+ implant region 232 is exposed to form a contact hole 244. Referring to FIGS. 17b and 17c, conductive material is filled into the contact hole 244 to form a contact plug 246. Next, a sacrifice insulating film 246 is formed over the entire semiconductor substrate and then etched for the contact plug 246 to be exposed. At this time, wider region including the contact plug 246 may be exposed. Subsequently, a lower electrode 250 connected to the contact plug 246, and a dielectric film 252 placed on the lower electrode 250 and an upper electrode 254 are formed. The lower electrode 250, the dielectric film 252 and the upper electrode 254 form one capacitor.

In FIGS. 17b and 17c, the first N+ implant region 210, the second N+ implant region 232 and the gate insulating film 234 form one transistor. A source terminal of a transistor (the second N+ implant region 232) is connected electrically to a capacitor (lower electrode 250, dielectric film 252 and upper electrode 254) through the contact plug 246. A transistor and a capacitor form one memory cell. The memory cell 100 is arranged such that its lateral and vertical intervals each corresponds to twice minimal process size (2F) and area occupied by one memory cell 100 equals to 4F2.

A gate (a gate insulating film 234) of a transistor of two adjoining memory cells based on the word line 238 as a boundary is connected electrically to the word line 238 through the gate electrode 236. The drain (the first N+ implant region 210) of a transistor of two adjoining memory cells 100 based on the bit line 220 as a boundary is shared and is connected electrically to the bit line 220.

While the present invention is described referring to the preferred embodiment, the present invention is not limited thereto, and thus various variation and modification can be made without departing from a scope of the present invention.

What is claimed:

1. A DRAM device comprising:
   plural word lines arranged parallel to each other in one direction;
   plural bit lines arranged parallel to each other and in an intersecting manner to the word line; and
   plural memory cells having a transistor and a capacitor connected electrically to a source terminal of the transistor in which a gate terminal of the transistor is filling an associated trench between two adjacent memory cells in a bit line direction and simultaneously covering a sidewall of said two adjacent memory cells via a gate insulating film interposed between the gate terminal and said two adjacent memory cells, and the gate terminal is connected electrically to the word line and a drain terminal of the transistor is connected electrically to the bit line wherein the gate terminal connected to one word line is arranged alternately to the gate terminal connected to an adjoining word line, and the drain terminal connected to one bit line is arranged alternately to the drain terminal connected to an adjoining bit line, and the gate terminal of the transistor of two adjoining memory cells in a direction of bit line is connected electrically with respect to the word line, and the drain terminal of the transistor of two adjoining memory cells in a direction of the word line is connected electrically with respect to one bit line, wherein an interval between the gate terminals in the bit or the word line direction, is more distant than 1F, and the F means minimal processing size.

2. A DRAM device according to claim 1, wherein the gate terminal is placed at an interval four times a bit line width and the drain terminal is placed at an interval four times a word line width.

3. A DRAM device according to claim 1, wherein the bit line is formed to be buried within a semiconductor substrate.

4. A DRAM device according to claim 1, wherein the drain terminal is spaced vertically from the source terminal and at least a part thereof is overlapped in a plane.

5. A memory device comprising:
   plural word lines arranged parallel to each other in one direction;
   plural bit lines arranged parallel to each other and in an intersecting manner to the plural word lines; and
   plural memory cells having a gate terminal of a transistor filling an associated trench between two adjacent memory cells in a bit line direction and simultaneously covering a sidewall of said two adjacent memory cells via a gate insulating film interposed between the gate terminal and said two adjacent memory cells, and the gate terminal is connected electrically to the word line and a drain terminal of the transistor is connected electrically to the bit line wherein the gate terminal connected to one word line is arranged alternately to the gate terminal connected to an adjoining word line, and the drain terminal connected to one bit line is arranged alternately to the drain terminal connected to an adjoining bit line, and the drain terminal of the transistor of two adjoining memory cells in the direction of the word line is connected electrically with respect to one bit line, wherein an interval between the gate terminals in the bit or the word line direction, is more distant than 1F, and the F means minimal processing size.

* * * * *